United States Patent
Hornung

(10) Patent No.: US 6,977,814 B2
(45) Date of Patent: Dec. 20, 2005

(54) DUAL MATERIAL HEAT SINK CORE ASSEMBLY

(75) Inventor: Craig Warren Hornung, Harrisburg, PA (US)

(73) Assignee: Tyco Electronics Corporation, Middletown, PA (US)

( * ) Notice: Subject to any disclaimer, the term of this patent is extended or adjusted under 35 U.S.C. 154(b) by 211 days.

(21) Appl. No.: 10/430,537

(22) Filed: May 6, 2003

(65) Prior Publication Data

US 2004/0223303 A1 Nov. 11, 2004

(51) Int. Cl.[7] ............................................. H05K 7/20
(52) U.S. Cl. ................ 361/690; 165/80.2; 165/80.3; 165/185; 257/718; 257/720; 361/704; 361/710; 361/707; 361/697; 361/688
(58) Field of Search ................. 165/80.2, 80.3, 165/121, 122; 174/16.3; 257/706–707, 712–713, 257/720, 718–719; 361/690, 697, 694–695, 361/704–722

(56) References Cited

U.S. PATENT DOCUMENTS

| | | | | |
|---|---|---|---|---|
| 5,594,623 | A | * | 1/1997 | Schwegler ................... 361/697 |
| 5,615,735 | A | * | 4/1997 | Yoshida et al. ............ 165/80.3 |
| 5,969,949 | A | | 10/1999 | Kim et al. ................... 361/704 |
| 6,758,263 | B2 | * | 7/2004 | Krassowski et al. ........ 165/185 |

* cited by examiner

*Primary Examiner*—Gregory Thompson

(57) ABSTRACT

A heat sink core assembly includes a base plate fabricated from a first material. The base plate comprises an opening therein, and the opening defines an insert engagement surface. An insert is fabricated from a second material different from the first material. The insert includes a base plate engagement surface and the insert is inserted into the opening. At least one of the insert engagement surface and the base plate engagement surface includes a curved portion. The curved portions oppose one another when the insert is engaged to the opening to produce a predetermined contact force in directions parallel and perpendicular to the opening in the base plate. When the opposed surfaces are crimped together, gaps or voids between the surfaces are avoided.

18 Claims, 4 Drawing Sheets

DUAL MATERIAL HEAT SINK CORE ASSEMBLY

BACKGROUND OF THE INVENTION

The invention relates generally to heat sinks for electronic devices, and more specifically, to dual material heat sink cores for cooling electronic devices.

The use of heat sinks on electronic components is well known. Typically, a heat sink is arranged in close contact with an electronic component, such as a processor chip. Heat generated by the component is transferred to the heat sink and dissipated therefrom. One type of heat sink includes a metallic core in the form of a base plate. Heat dissipating fins extend from the base plate to increase the surface area of the heat sink. Heat transferred from the component to the base plate is spread throughout the base plate and to the fins fixed to the base plate. A fan element circulates air about outer surfaces of the fins and the base to facilitate the transfer of heat from the fins to the air, thereby dissipating heat from the electronic component.

For improved performance, some types of heat sink cores include a cylindrical or rectangular insert or slug in the base plate that is fabricated from a different material (e.g., copper or silver) having a higher thermal conductivity than the base plate, typically fabricated from aluminum. The insert increases the thermal conductivity of the base plate and reduces spreading resistance that inhibits rapid heating of the base plate.

Typically the insert is press fit into an opening in the base plate. The press fit generates elastic forces between the base plate and the insert in a direction parallel to the plane of the opening in the base plate (i.e., a horizontal force). The press fit, however, produces little or no elastic force between the base plate and the insert in a direction perpendicular to the plane of the opening in the base plate (i.e., a vertical force), sometimes referred to as a normal contact force. The amount of normal contact force, however, has been found to substantially affect the performance of the heat sink, especially when the insert is located directly over the heat source. The lack of normal contact force can undesirably result in an air gap being formed between a top surface of the insert and the bottom surface of the base plate. Because the resistance of air is high, heat flow in a vertical direction from the insert to the base plate can be substantially impaired.

In another type of heat sink, the copper or silver inserts are attached to the base plate with a screw, thereby imparting a normal contact force between the insert and the base plate. Inserts attached to a base plate with screws, however, tend to produce little or no contact force between the insert and the base plate in a direction parallel to the base plate. The lack of horizontal contact force reduces heat flow in a horizontal direction between the base plate and the insert, thereby reducing the efficiency of the heat sink. Additionally, to create the desired normal force in these types of heat sinks, the screws are to be located directly over the heat source. Locating the screws directly over the heat source, however, is not always feasible.

BRIEF DESCRIPTION OF THE INVENTION

According to an exemplary embodiment, a heat sink core assembly is provided. The assembly comprises a base plate fabricated from a first material. The base plate comprises an opening therein, and the opening defines an insert engagement surface. An insert is fabricated from a second material different from the first material. The insert includes a base plate engagement surface and the insert is inserted into the opening. At least one of the insert engagement surface and the base plate engagement surface includes a curved portion.

Optionally, the opening in the base plate may be a dovetail slot having first and second side walls that are configured to engage the base plate and maintain the insert in position relative to the base plate. Each of the insert engagement surface and the base plate engagement surface may include curved portions located opposite one another when the insert is engaged to the opening to produce a predetermined contact force in directions parallel and perpendicular to the opening in the base plate. When the opposed surfaces are crimped together, gaps or voids between the surfaces are avoided. A fin may be provided that is fabricated from a material similar to the base plate, i.e., copper or aluminum, and the fin may be crimped to the base plate for enhanced heat transfer.

In another embodiment, a heat sink core assembly for cooling an electronic component is provided. The core assembly comprises a base plate fabricated from a first material and comprising a dovetail slot therein. The dovetail slot surrounds an insert engagement surface, and an insert is fabricated from a second material different from the first material. The insert is inserted into the dovetail slot and includes a base plate engagement surface. At least one of the insert engagement surface and the base plate engagement surface includes a convex portion.

In another embodiment, a heat sink core assembly for cooling a component is provided. The core assembly comprises a base plate fabricated from a first material and comprising an insert engagement surface, and an insert is fabricated from a second material different from the first material. The insert includes a base plate engagement surface, and the insert engagement surface and the base plate engagement surface are configured to create a beneficial normal force between the insert and the base plate and to produce a substantially zero void interface between the insert and the base plate. A resilient clip retains the heat sink core assembly to the component.

DETAILED DESCRIPTION OF THE INVENTION

Figure 1:
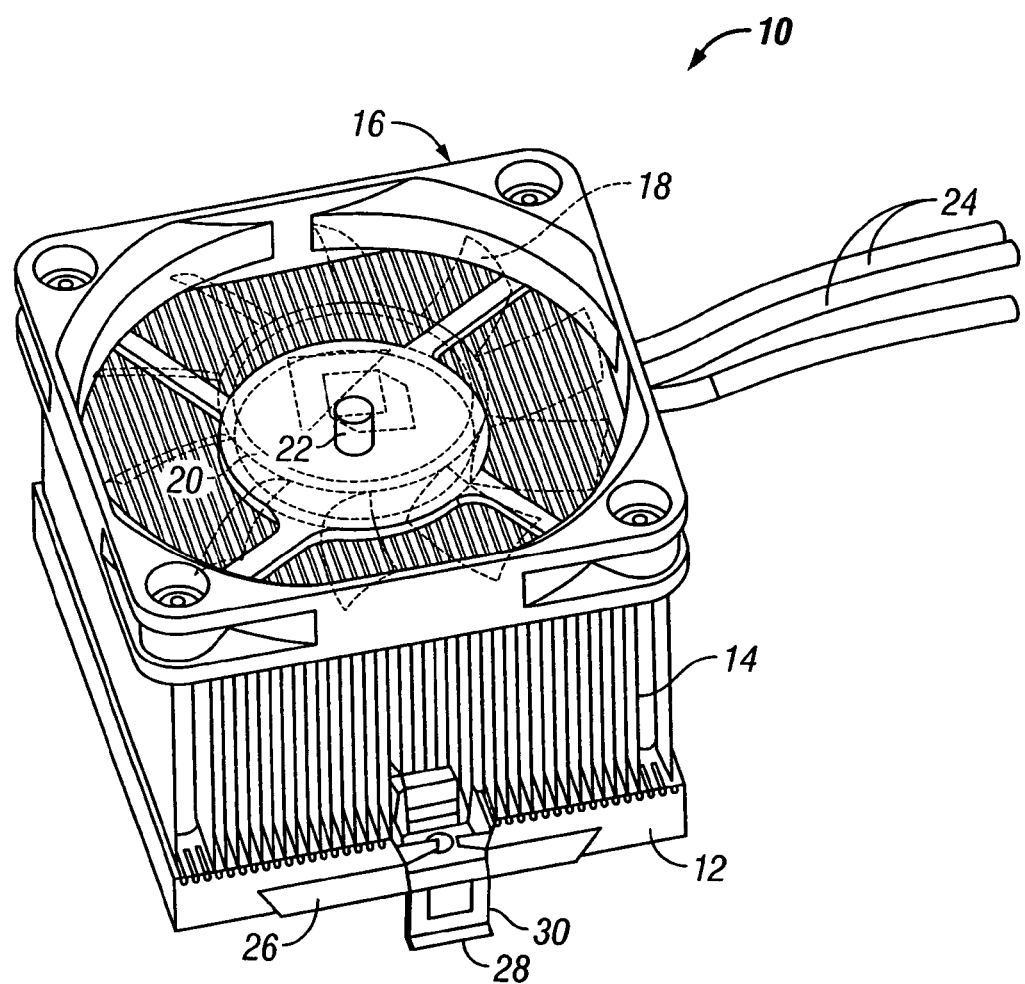
FIG. 1 is a perspective view of a heat sink assembly formed in accordance with an exemplary embodiment of the invention.

FIG. 1 is a perspective view of a heat sink assembly 10 for drawing and dissipating heat from a heat generating component or heat source (not shown in FIG. 1). While embodiments of the invention are described and illustrated in the context of cooling electronic components, it is recognized that the invention may likewise be used in other applications beyond the cooling of electronic components. The embodiments set forth herein are therefore provided for illustrative purposes only, and the invention is not intended to be limited to a particular end use or application.

In an illustrative embodiment, the heat sink assembly 10 includes a base plate 12, a number of fins 14 extending substantially vertically from the base plate 12, and a fan assembly 16 for circulating air over the fins 14 and the base plate 12. The base plate 12 is fabricated from metal, such as aluminum or copper, for example, and the base plate 12 is substantially rectangular in an illustrative embodiment. The fins 14 are thin vertical plate members fabricated from metal, such as aluminum in an exemplary embodiment, and the fins 14 are coupled to the base plate 12 in a spaced apart relationship to one another. In one embodiment, the fins 14 and the base plate 12 are each fabricated from the same material such as aluminum. In another embodiment, the fins 14 and the base plate 12 are fabricated from different materials. For example, aluminum fins 14 may be coupled to a copper base plate 12 for enhanced heat transfer from the base plate 12 to the fins 14. The fins 14 may be attached to the base plate 12 via a known process or technique, such as crimping and the like.

The fan assembly 16 includes a number of vanes 18 extending from a hub 20 that is rotationally mounted to a shaft 22. Power is supplied to the fan assembly 16 via lead wires 24 which energize a motor to rotate the hub 20 and the vanes 18 about the shaft 22 to circulate air downward upon the outer surfaces of the fins 14 and the base plate 12. When the base plate 12 is located in contact with a heat generating electronic component (not shown in FIG. 1), such as, for example, a processor chip, heat generated from the electronic component is transferred to the base plate 12 and to the fins 14, thereby cooling the electronic component in operation.

For improved heat dissipation performance, the base plate 12 includes an insert 26 fitted into the base plate 12. The insert 26 is fabricated from a metal having a higher thermal conductivity than the base plate 12, and in use the insert 26 is placed in contact with the component to be cooled. Thus, for example, if the base plate is fabricated from aluminum the insert 26 may be fabricated from copper or silver. If the base plate is fabricated from copper or silver, then the insert may be fabricated from another metal or alloy having a higher thermal conductivity. It is recognized that the base plate 12 and the insert 26 may be fabricated from a variety of metals, alloys, and materials in various alternative embodiments without departing from the scope and spirit of the invention.

For the reasons explained below, and unlike known inserts, the insert 26 generates both a normal (i.e., vertical) contact force between the base plate 12 and the insert 26 and a horizontal contact force between the base plate 12 and the insert 26. Additionally, as also explained below, the insert 26 and the base plate 12 substantially eliminate gaps or voids between the base plate 12 and the insert 26 when assembled. Elimination of voids between the insert 26 and the base plate 12 eliminates air pockets having a high resistance between the inserts 26 and the base plate 12, thereby improving heat transfer efficiency at the interface between the base plate 12 and the insert 26.

A resilient clip 28 extends across opposite sides of the base plate 12 and in between some of the fins 14. The clip 28 includes a latch member 30 that secures the clip 28 to a mounting feature (not shown) on, for example, a circuit board (not shown) wherein an electronic component to be cooled by the heat sink assembly 10 is installed. Alternatively, the heat sink assembly 10 is coupled directly to a component or a retention device mounted to the board to be cooled with the clip 28. In either case, the clip 28 applies a force to ensure contact between the base plate 12, and more specifically the insert 26, and the heat source to be cooled.

Figure 2:
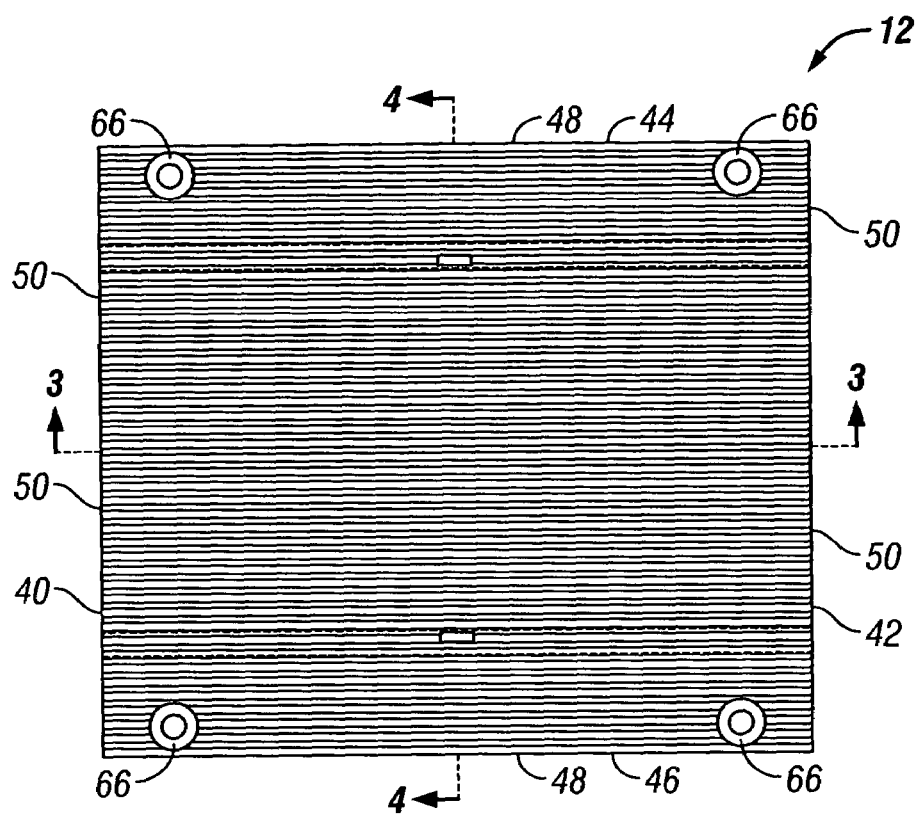
FIG. 2 is top plan view of an exemplary base plate for the heat sink assembly shown in FIG. 1.
Figure 3:
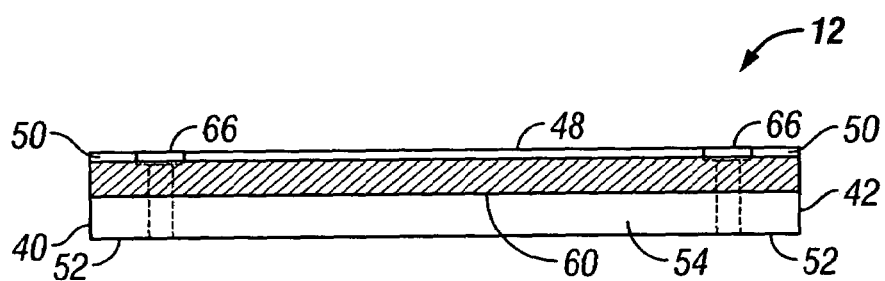
FIG. 3 is a cross sectional view of the base plate shown in FIG. 2 along line 3—3.
Figure 4:
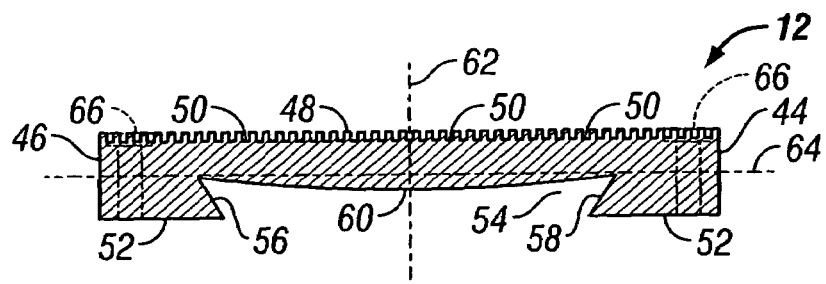
FIG. 4 is a cross sectional view of the base plate shown in FIG. 2 along line 4—4.

FIG. 2 is top plan view of the base plate 12, and FIGS. 3 and 4 are cross sectional views of the base plate 12 taken along lines 3—3 and 4—4 in FIG. 1. The base plate 12 includes a first pair of opposite side edges 40 and 42 and a second pair of opposite side edges 44 and 46 in a substantially rectangular arrangement. The base plate 12 includes a top surface 48 including a number of rectangular slots 50 therein arranged substantially parallel to one another and extending between the side edges 40 and 42. The slots 50 receive the fins 14 (shown in FIG. 1) to position the fins 14 in a desired orientation relative to the base plate 12.

A bottom surface 52 extends opposite the top surface 48 and is substantially flat. An elongated opening or slot 54 is formed into the base plate 12 beneath the top surface 48 and extends longitudinally between the side edges 40 and 42. In an exemplary embodiment, the slot 54 has a shape sometimes referred to as a "dovetail" shape and is substantially centered between the lateral side edges 44 and 46. The slot 54 includes inclined side walls 56 and 58 and an engagement surface 60 extending between the side walls 56 and 58. The side walls 56 and 58 extend from the bottom surface 52 in a direction toward the respective side walls 40 and 46 and also toward the top surface 48. As such, the side walls 56 and 58 of the slot 54 are oppositely inclined from one another. That is, one of the side walls 58 has a positive slope extending from the bottom surface 52 and the other of the side walls 56 has a negative slope extending from the bottom surface 52. Stated still another way, the side walls 56 and 58 of the slot 54 are outwardly tapered from the bottom surface 52 to the engagement surface 60 such that a width between the side walls 56 and 58 increases from the bottom surface 52 to the slot 54.

The engagement surface 60 of the slot 54 extends between the side walls 56 and 58 at an elevation between the top surface 48 and the bottom surface 52. In other words, the top surface 48 is located above the engagement surface 60 of the slot 54 and the bottom surface 52 is located below the engagement surface 60 as illustrated in FIG. 4, and the engagement surface 60 is accessible through the slot 54. The engagement surface 60 is outwardly curved between the ends of the side walls 56 and 58. For example, the engagement surface 60 may be slightly convex or crowned toward the bottom surface 52 of the base plate 12. In an illustrative embodiment, the engagement surface 60 extends substantially along an entire length of the base plate 12 between the side edges 40 and 42, although it is appreciated that in alternative embodiments only a portion of the length of the base plate 12 may include the engagement surface 60.

As explained further below, the curvature of the engagement surface 60 establishes a normal contact force between the base plate 12 and the insert 26 (shown in FIG. 1) in a direction parallel to an axis 62 (shown in FIG. 4) extending substantially perpendicular to the top surface 48 and the bottom surface 52 of the base plate 12. In addition, the slot 54 facilitates horizontal contact force between the base plate 12 and the insert 26 in a direction parallel to an axis 64 extending substantially parallel to top and bottom surfaces 48 and 52 of the base plate 12. Still further, the curvature of the engagement surface 60 facilitates a solid contact interface between the base plate 12 and the insert 26 with substantially no voids, gaps or air pockets which reduce heat transfer between the base plate 12 and the insert 26.

Mounting apertures 66 are provided adjacent each of the side edges 44 and 46 and slightly offset from the side edges 40 and 42 of the base plate 12. The mounting apertures 66 are therefore located approximately in the four corners of the base plate 12. When the heat sink assembly 10 (shown in FIG. 1) is assembled, the mounting apertures 66 receive a screw or other known coupling member to secure the base plate 12 to the remainder of the heat sink assembly 10.

Figure 5:
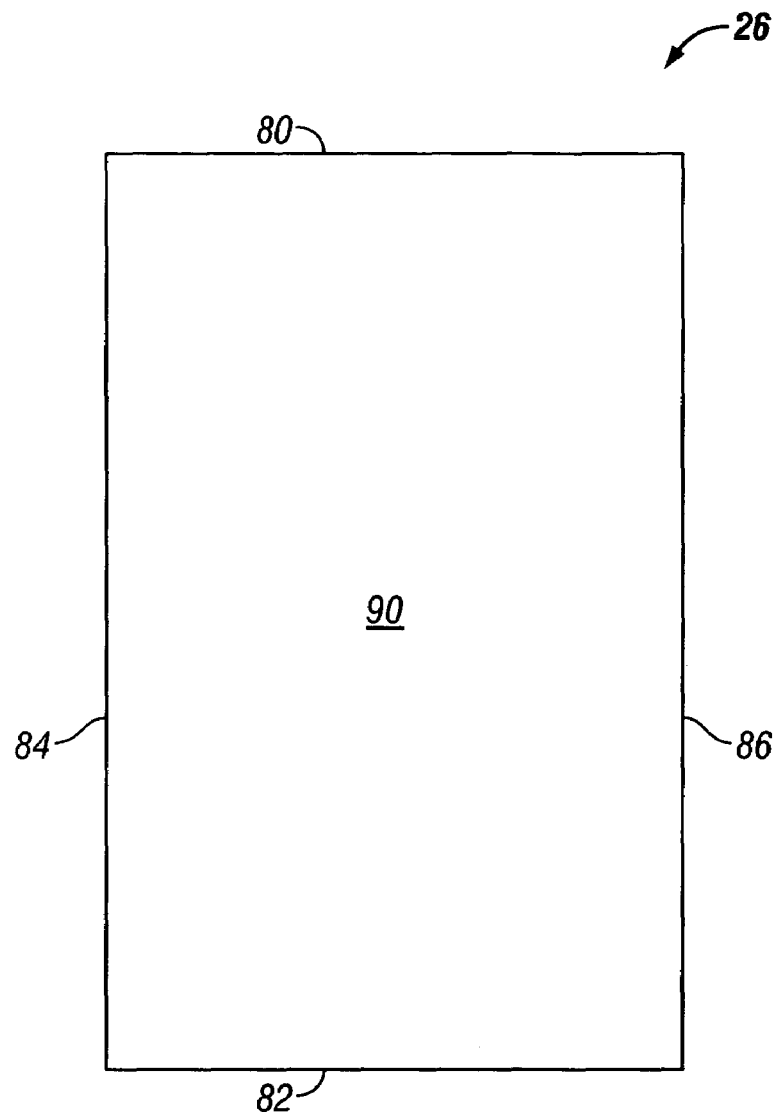
FIG. 5 is a top plan view of an exemplary insert for the base plate shown in FIGS. 2 and 3.
Figure 6:
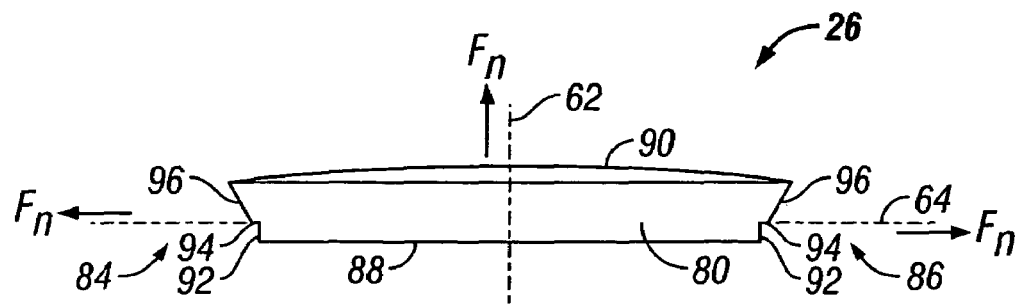
FIG. 6 is an end elevational view of the insert shown in FIG. 4.

FIGS. 5 and 6 are a top plan view and an end elevational view of the insert 26 formed in accordance with an exemplary embodiment of the invention. The insert 26 includes substantially flat end edges 80 and 82 and contoured side edges 84 and 86. A bottom surface 88 extends between lower ends of the contoured side edges 84 and 86, and an engagement surface 90 extends between upper ends of the contoured side edges 84 and 86. The contoured side edges 84 and 86 each include a flat base portion 92 extending substantially perpendicular to the bottom surface 88, a shelf portion 94 extending substantially perpendicular to the base portion 94 and substantially parallel to the bottom surface 88. An inclined dovetail portion 96 extends from the shelf portion 94 to the engagement surface 90.

The inclined dovetail portions 96 of the side edges 84 and 86 are shaped and dimensioned to be received in the dovetail slot 54 (shown in FIGS. 3 and 4) of the base plate 12. Thus, similar to the slot 54, the inclined dovetail portions 96 of the side edges 84 and 86 extend in an outward direction from the shelf portions 94 toward the engagement surface 90. As such, the dovetail portions 96 of the side edges 84 and 86 are oppositely inclined from one another. By way of example, one of the dovetail portions 96 has a positive slope extending from the shelf portion 94 to the engagement surface 90 and the other of the dovetail portions 96 has a negative slope extending from the shelf portion 94 to the engagement surface 90. Optionally, the dovetail portions 96 of the side edges 84 and 86 are outwardly tapered from the bottom shelf portions 94 to the engagement surface 60 such that a width between the dovetail portions 96 increases from the shelf portions 94 to the engagement surface 90.

Also similar to the slot 54 in the base plate 12, the engagement surface 90 is outwardly curved between the upper ends of the contoured side edges 84 and 86. That is, the engagement surface 90 is slightly convex or crowned. In an illustrative embodiment, the crowned engagement surface 90 extends substantially an entire length of the insert 26 between the end edges 80 and 82, although it is appreciated that in alternative embodiments only a portion of the length of the insert 26 may include the crowned engagement surface 90.

When the insert 26 is engaged to the slot 54 in the base plate 12, the dovetail portions 96 of the side edges 84 and 86 of the insert 26 contact the respective side walls 56 and 58 of the slot 54. The engagement surface 90 of the insert 26 is opposed to the engagement surface 60 of the slot 54, and as each of the engagement surfaces 90 and 60 are outwardly curved, the engagement surfaces 90 and 60 naturally interfere with one another as the insert 26 is inserted into the slot 54. The interference between the engagement surfaces 90 and 60 creates an elastic normal contact force $F_n$ between the engagement surfaces 90 and 60 in a direction parallel to the axis 62 extending substantially perpendicular to the bottom surface 88 of the insert 26 when the engagement surfaces 90 and 60 are interfaced with one another. The normal contact force $F_n$ facilitates heat transfer from the insert 26 to the base plate 12 in a vertical direction (i.e., parallel to the axis 62) when the insert 26 is positioned in contact with a heat generating component, such as an electronic component.

The interference of the opposed engagement surfaces 90 and 60 and the associated normal force when the insert 26 is inserted into the base plate 12 also presses the dovetail portions 96 of the insert 26 against the side walls 56 and 58 of the slot 54. Horizontal contact force $F_h$ between the dovetail portions 96 of insert 26 and the side walls 56 and 58 of the slot 54 in a direction parallel to the axis 64 is therefore established. The horizontal contact force $F_h$ maintains the insert 26 in position relative to the base plate 12 and facilitates heat transfer from the insert 26 to the base plate 12 in a horizontal direction. Still further, the curvature of the engagement surface 60 facilitates a solid contact interface between the base plate 12 and the insert 26 with substantially no voids, gaps or air pockets which negatively impact heat transfer between the base plate 12 and the insert 26, as explained below.

The opposed curvature of the engagement surface 90 of the insert 26 and the engagement surface 60 of the slot 54 therefore produces beneficial normal force and horizontal contact force between the insert 26 and the base plate 12, each of which improves heat flow in the respective vertical and horizontal directions. Each of these effects, however, is enhanced when the insert 26 and the base plate 12 are crimped together. As the insert 26 and the base plate 12 are crimped, the opposed engagement surfaces 90 and 60 are flattened from the center thereof toward the side edges. In the crimping process, any air between the engagement surfaces 90 and 60 is displaced laterally and expelled from the end edges 80 and 82 of the insert 26 and the side walls 40 and 42 of the base plate 12, thereby effectively evacuating air from between the surfaces 90 and 60. Voids, gaps, and associated parasitic air pockets and layers are therefore substantially avoided and a substantially complete metal-to-metal contact interface is established, sometimes referred to herein as a zero void interface between the insert 26 and the base plate 12. By avoiding high resistance air in the interface with a zero void interface, thermal transfer between the insert 26 and the base plate 12 is optimized.

By varying the curvature of the engagement surfaces 90 and 60, varying degrees of normal contact force and horizontal contact force may be obtained between the base plate 12 and the insert 26. The curvature may be selected to produce a predetermined amount of contact force for a given application to optimize heat flow and thermal transfer between the base plate 12 and the insert 26. Additionally, while one exemplary dovetail shape of the insert 26 has been described, it is appreciated that other complementary shapes of inserts 26 and slot 54 in the base plate 12 may be employed in various alternative embodiments of the invention. The dovetail shape is therefore set forth for purposes of illustration rather than limitation.

Figure 7:
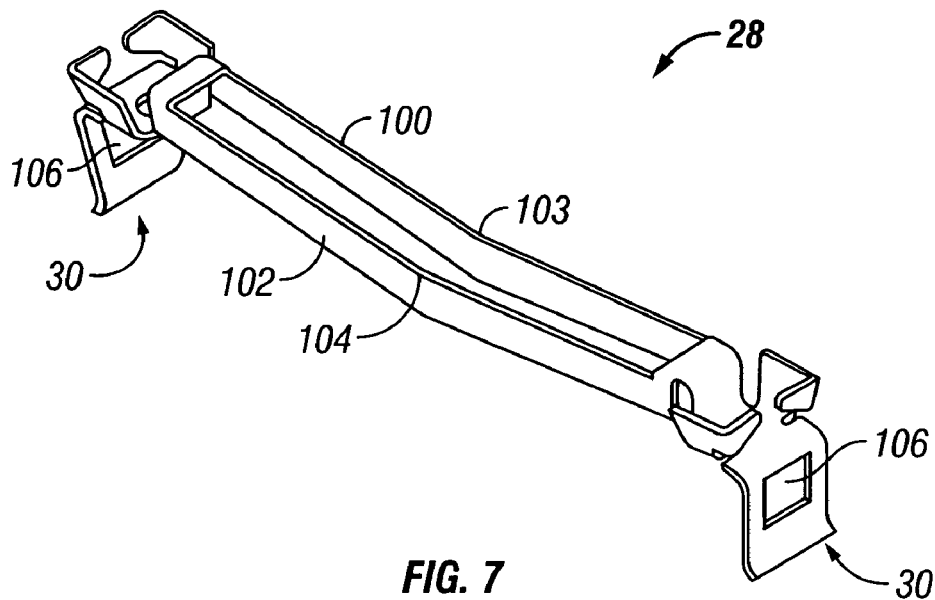
FIG. 7 is a perspective view of an exemplary spring clip for the heat sink assembly shown in FIG. 1.

FIG. 7 is a perspective view of resilient clip 28 for the heat sink assembly 10 which extends over the base plate 12 (shown in FIGS. 1–4) and ensures contact force between the insert 26 (shown in FIGS. 1, 5 and 6) and a heat source to be cooled, such as a heat generating electronic component (not shown in FIG. 7). The clip 28 includes a pair of bowed bridge members 100, 102 extending in a parallel, spaced apart relationship to one another so that one or more fins 14 (shown in FIG. 1) may extend between the bridge members 100, 102. The bridge members 100, 102 are also thin enough to extend between adjacent fins 14 when the heat sink assembly 10 is assembled. The bridge members are depressed or bowed at a respective center 103, 104 thereof such that the bridge members 100, 102 assume a shallow V-shape in a relaxed state. Latch members 30 extend from the opposite ends of the bridge members 100, 102 and each latch member 30 includes a lock aperture 106 extending therethrough which receives a locking projection (not shown) to which the clip 28 may be retained.

In use, the clip 28 is extended over the top surface 48 (shown in FIGS. 2–4) of the base plate 12 such that the bridge members 100 and 102 extend between the fins 14 and the latch members 30 project beyond the fins 14. As the latch members 30 are engaged and latched in position, the bridge members 100, 102 flex and exert a downward force upon the top surface 48 of the base plate 12. The downward force ensures contact between the insert 26 (shown in FIGS. 1, 5 and 7) and the component to be cooled. An amount of downward force may be varied in different applications with different configurations or gages of clips 28. While one exemplary clip 28 is illustrated, it is appreciated that a variety of spring clips, resilient members, and spring elements could be used in alternative embodiments of the invention to achieve similar benefits without departing from the scope and spirit of the instant invention.

Figure 8:
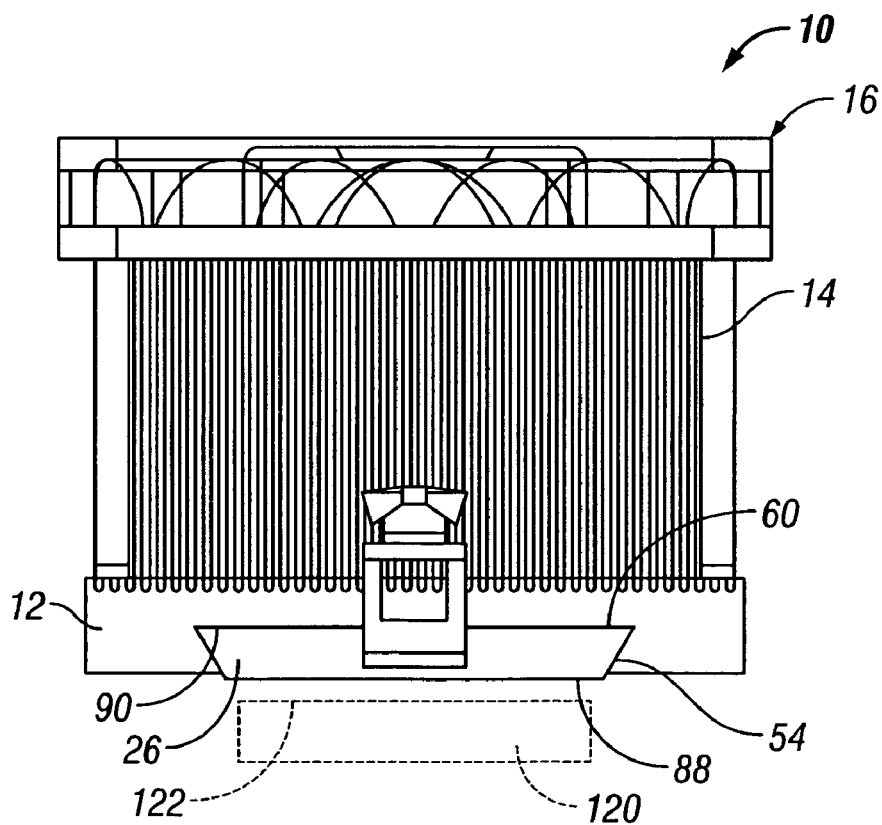
FIG. 8 is a side elevational view of the heat sink assembly shown in FIG. 1.

FIG. 8 is a side elevational view of the heat sink assembly 10 in an assembled form and located proximate a component 120 to be cooled, which may be an electric or electronic component, such as a processor chip mounted to a circuit board. The insert 26 is fitted into the slot 54 in the base plate 12, and the engagement surface 90 of the insert 26 is engaged to the engagement surface 60 of the slot 54. The engagement surfaces 90 and 60 of the insert 26 and the base plate 12 are crimped together to form a flat interface therebetween without gaps or voids to produce a zero void interface as described above. The latch members 30 of the clip 28 may be employed to clamp the base plate 12, including the insert 26, to the component 120 to ensure physical contact thereto.

When the bottom surface 88 of the insert 26 contacts the top surface 122 of the component 120, heat generated in the component 120 is transferred to the insert 26. Because of the beneficial normal contact force by virtue of the opposed engagement surfaces 90 and 60 of the insert 26 and the base plate 12, heat is rapidly transferred in vertical and horizontal directions from the insert 26 to the base plate 12 and the fins 14. The fan assembly 16 circulates ambient air over the surfaces of the fins 14 to transfer heat to the air, thereby dissipating heat from the component 120.

While the invention has been described in terms of various specific embodiments, those skilled in the art will recognize that the invention can be practiced with modification within the spirit and scope of the claims.

What is claimed is:

1. A heat sink core assembly comprising:
   a base plate fabricated from a first material and comprising an opening therein, said opening defining an insert engagement surface; and
   an insert fabricated from a second material different from said first material, said insert including a base plate engagement surface, said insert being inserted into said opening, wherein at least one of said insert engagement surface and said base plate engagement surface includes a convex surface.

2. A heat sink core assembly in accordance with claim 1 further comprising at least one fin crimped to said base plate.

3. A heat sink core assembly in accordance with claim 1 wherein said insert has inclined side walls that are configured to engage said base plate and maintain said insert in position relative to said base plate.

4. A heat sink core assembly in accordance with claim 1, wherein each of said insert engagement surface and said base plate engagement surface includes a respective said convex surface.

5. A heat sink core assembly in accordance with claim 4, wherein said convex surfaces are opposed to one another.

6. A heat sink core assembly in accordance with claim 1 wherein said insert engagement surface and said base plate engagement surface are adapted to produce substantially a zero void interface when engaged to one another.

7. A heat sink core assembly in accordance with claim 1, wherein said opening defines a dovetaile slot having inclined side walls that are configured to load said insert against said insert engagement surface.

8. A heat sink core assembly in accordance with claim 1, wherein said opening defines a dovetail slot, and said insert comprises a body having a dovetail shape that is complementary to said dovetail slot.

9. A heat sink core assembly for cooling an electronic component, said core assembly comprising:
   a base plate fabricated from a first material and comprising a dovetail slot therein, said dovetail slot surrounding an insert engagement surface; and
   an insert fabricated from a second material different from said first material, said insert being inserted into said dovetail slot and including a base plate engagement surface, wherein at least one of said insert engagement surface and said base plate engagement surface includes a convex surface.

10. A heat sink core assembly in accordance with claim 9 wherein said insert comprises a body comprising at least one sloped side configured to engage said dovetail slot.

11. A heat sink core assembly in accordance with claim 9, wherein each of said insert engagement surface and said base plate engagement surface includes a respective said convex surface.

12. A heat sink core assembly in accordance with claim 9, wherein each of said insert engagement surface and said base plate engagement surface comprises a respective said convex surface, said convex surfaces opposed to one another when said insert is engaged to said opening.

13. A heat sink core assembly in accordance with claim 9 wherein said insert engagement surface and said base plate engagement surface are adapted to produce substantially a zero void interface when engaged to one another.

14. A heat sink core assembly in accordance with claim 9, each of said insert engagement surface and said base plate engagement surface comprising a respective said convex surface, said convex surfaces opposed to one another when said insert is received in said slot.

15. A heat sink core assembly for cooling a component, said core assembly comprising:
   a base plate fabricated from a first material and comprising an insert engagement surface and a dovetail slot;
   an insert fabricated from a second material different from said first material, said insert including a base plate engagement surface and inclined sides, said insert configured for an interference fit in said dovetail slot, wherein said insert engagement surface is urged against said base plate engagement surface to create a normal contact force therebetween.

16. A heat sink core assembly in accordance with claim 15, wherein said insert engagement surface and said base plate engagement surface include respective convex surfaces that are opposed to one another.

17. A heat sink core assembly in accordance with claim 15 further comprising at least one fin crimped to said base plate.

18. A heat sink core assembly in accordance with claim 15 further comprising a plurality of fins extending from a surface of said base plate opposite said insert, said insert being outwardly flared in a direction toward said fins to facilitate heat flow to said fins.

* * * * *